US012615043B2

(12) United States Patent
Sato

(10) Patent No.: US 12,615,043 B2
(45) Date of Patent: Apr. 28, 2026

(54) SEMICONDUCTOR DEVICE AND OVERCURRENT PROTECTION DEVICE

(71) Applicant: FUJI ELECTRIC CO., LTD., Kawasaki (JP)

(72) Inventor: Shigeki Sato, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 32 days.

(21) Appl. No.: 18/606,156

(22) Filed: Mar. 15, 2024

(65) Prior Publication Data

US 2024/0223181 A1     Jul. 4, 2024

Related U.S. Application Data

(63) Continuation of application No. PCT/JP2023/014242, filed on Apr. 6, 2023.

(30) Foreign Application Priority Data

Apr. 11, 2022     (JP) ................................. 2022-065091

(51) Int. Cl.
*H03K 17/08* (2006.01)
*H02H 3/087* (2006.01)
*H03K 17/082* (2006.01)

(52) U.S. Cl.
CPC ......... *H03K 17/0828* (2013.01); *H02H 3/087* (2013.01); *H03K 17/0822* (2013.01); *H03K 2217/0027* (2013.01)

(58) Field of Classification Search
CPC ...... H03K 17/00; H03K 17/08; H03K 17/082; H03K 17/0822; H03K 17/0826; H03K 17/0828; H02H 3/00; H02H 3/08
(Continued)

(56) References Cited

U.S. PATENT DOCUMENTS 12,074,592 B2 * 8/2024 Takuma ............. H03K 17/0822
2015/0185275 A1 7/2015 Sekigawa
(Continued)

FOREIGN PATENT DOCUMENTS

JP     2009-165285 A     7/2009
JP     2015-233133 A     12/2015
(Continued)

OTHER PUBLICATIONS

International Search Report for PCT/JP2023/014242, mailed on Jun. 13, 2023.
Written Opinion for PCT/JP2023/014242, mailed on Jun. 13, 2023.

*Primary Examiner* — Hai L Nguyen

(57) ABSTRACT

A semiconductor device includes an output element configured to switch on and off based on a drive signal, so as to drive a load, a current monitoring element configured to monitor a current that flows through the output element, and a voltage control circuit that includes a first diode configured to charge a gate voltage applied to a gate of the current monitoring element and a second diode configured to discharge the gate voltage, so that the voltage control circuit controls the gate voltage. An anode of the first diode is connected to a gate of the output element and a cathode of the second diode, and a cathode of the first diode is connected to an anode of the second diode and the gate of the current monitoring element.

9 Claims, 17 Drawing Sheets

(58) Field of Classification Search
  USPC .......................................... 327/427, 432–434
  See application file for complete search history.

(56)                    References Cited

U.S. PATENT DOCUMENTS

| | | | | |
|---|---|---|---|---|
| 2015/0325558 A1* | 11/2015 | Hikasa | ................. | H10D 12/032 |
| | | | | 257/49 |
| 2016/0011266 A1* | 1/2016 | Osanai | ................... | G01R 31/42 |
| | | | | 324/762.01 |
| 2019/0280473 A1 | 9/2019 | Akahane | | |
| 2020/0028505 A1 | 1/2020 | Sasaki | | |

FOREIGN PATENT DOCUMENTS

| | | | |
|---|---|---|---|
| JP | 2016-021652 | A | 2/2016 |
| JP | 2019-149558 | A | 9/2019 |
| JP | 2020-014103 | A | 1/2020 |
| WO | 2014/097739 | A1 | 6/2014 |
| WO | 2018/211840 | A1 | 11/2018 |

* cited by examiner

SEMICONDUCTOR DEVICE AND OVERCURRENT PROTECTION DEVICE

CROSS-REFERENCE TO RELATED APPLICATION

This application is a continuation application of International Application PCT/JP2023/014242 filed on Apr. 6, 2023, which designated the U.S., which claims priority to Japanese Patent Application No. 2022-065091, filed on Apr. 11, 2022 the entire contents of which are incorporated herein by reference.

BACKGROUND OF THE INVENTION

1. Field of the Invention

The embodiment discussed herein relates to a semiconductor device and an overcurrent protection device.

2. Background of the Related Art

Recent years have seen progress in the development of next-generation semiconductor elements such as silicon carbide (SiC) semiconductor elements and gallium nitride (GaN) semiconductor elements, as next-generation technology of insulated gate bipolar transistors (IGBTs), which are power semiconductor elements.

For example, as a related technique, there has been proposed a technique for detecting a transient sense period of a detected signal of a sense current in response to turning on of a semiconductor element and controlling the semiconductor element based on the detected signal of the sense current in the transient sense period (International Publication Pamphlet No. WO 2018/211840). There has also been proposed a semiconductor device including an on-side diode connected in the forward direction with respect to a positive gate voltage to an on-side resistance wiring connected to a gate electrode of a sense IGBT cell and including an off-side diode connected in the reverse direction with respect to the positive gate voltage to an off-side resistance wiring of the sense IGBT cell (Japanese Laid-open Patent Publication No. 2019-149558).

A semiconductor device referred to as an intelligent power switch (IPS) includes a main IGBT, which is a power semiconductor element for operating a load, and includes a sense IGBT, which is a current-monitoring power semiconductor element, which allows a sense current proportional to a current flowing through the main IGBT to flow. The IPS also includes an overcurrent detection circuit for detecting an overcurrent flowing through the main IGBT based on a detected signal of the sense current (a sense current detection signal).

However, with the conventional IPS configuration as described above, an oscillation occurs in the sense current detection signal in a period from a transient rise to a transient fall of the sense current detection signal (in a transient sense period). In this case, for example, if an oscillation having a voltage value over the rating occurs, the overcurrent detection circuit could malfunction or devices such as the IGBTs could break. Thus, the conventional IPS configuration as described above has a problem in that the reliability of the device operation could be deteriorated.

SUMMARY OF THE INVENTION

According to an aspect, there is provided a semiconductor device, including: an output element configured to switch on and off based on a drive signal, so as to drive a load; a current monitoring element configured to monitor a current that flows through the output element; and a voltage control circuit that includes a first diode configured to charge a gate voltage applied to a gate of the current monitoring element and a second diode configured to discharge the gate voltage, so that the voltage control circuit controls the gate voltage.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
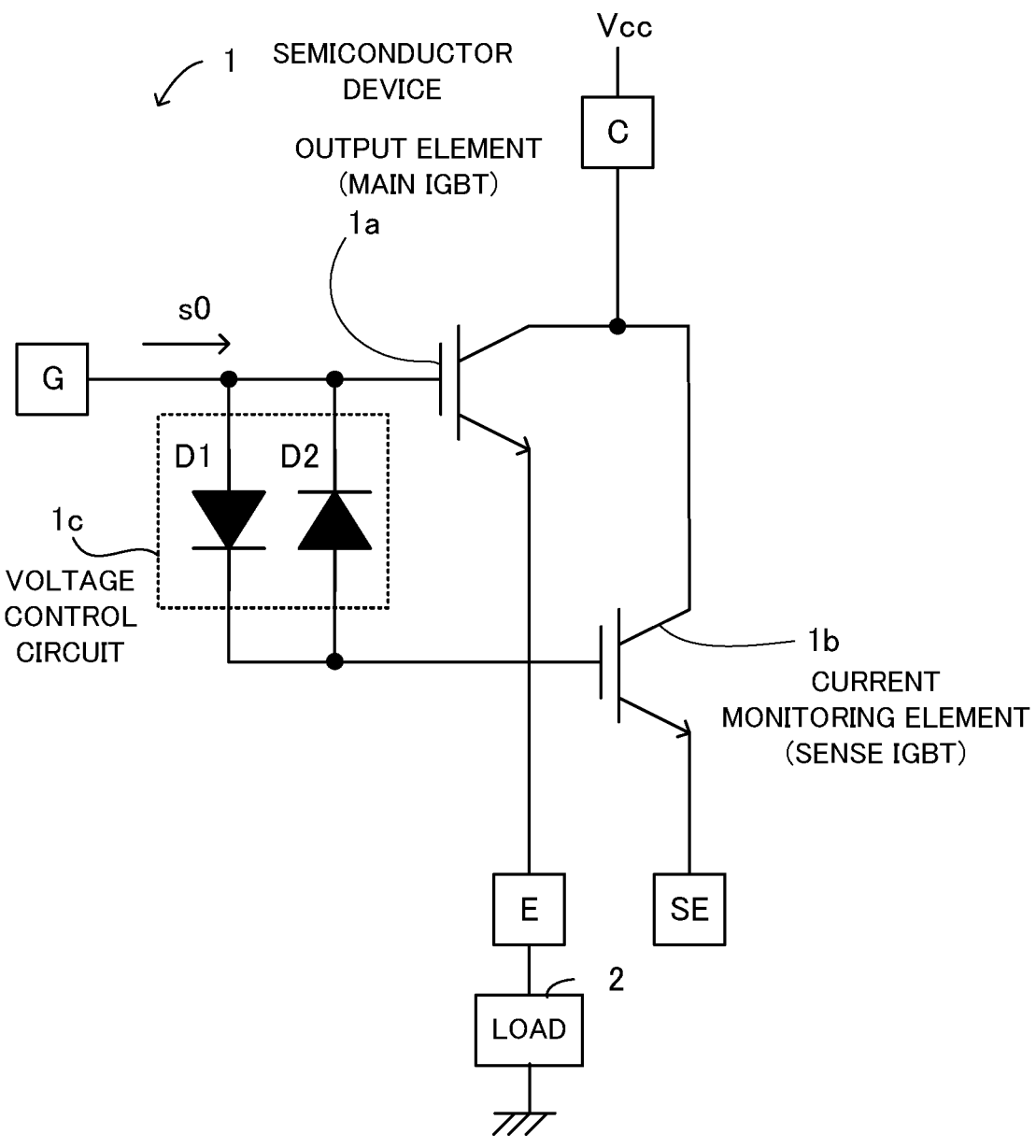
FIG. 1 illustrates an example of a semiconductor device.

Hereinafter, embodiments will be described with reference to the accompanying drawings. Throughout the description and the accompanying drawings, the elements having substantially the same functions will be denoted by the same reference characters, and redundant description thereof will be omitted as needed.

FIG. 1 illustrates an example of a semiconductor device. This semiconductor device 1 includes an output element 1a, a current monitoring element 1b, and a voltage control circuit 1c. The voltage control circuit 1c includes a diode D1 (a first diode) that charges a gate voltage applied to the gate of the current monitoring element 1b and a diode D2 (a second diode) that discharges the gate voltage, and controls the gate voltage of the current monitoring element 1b.

Examples of the output element 1a and the current monitoring element 1b include an IGBT and a reverse-conducting (RC)-IGBT obtained by forming an IGBT and a free-wheeling diode (FWD) on one chip. A SiC device may alternatively be used. Examples of the SiC device include a SiC metal-oxide-semiconductor field-effect transistor (MOSFET) or the like. Hereinafter, the output element will be referred to as a main IGBT, and the current monitoring element will be referred to as a sense IGBT.

The collector of the main IGBT 1a and the collector of the sense IGBT 1b are connected to a power supply voltage Vcc via a terminal C. The emitter of the main IGBT 1a is connected to a load 2 via a terminal E. The sense emitter of the sense IGBT 1b is connected to a terminal SE.

The anode of the diode D1 is connected to a terminal G, the gate of the main IGBT 1a, and the cathode of the diode D2. The cathode of the diode D1 is connected to the anode of the diode D2 and the gate of the sense IGBT 1b.

The main IGBT 1a performs switching based on a drive signal s0, so as to operate (drive) the load 2. In this case, when the drive signal s0 instructs the turning on of the main IGBT 1a, the main IGBT 1a turns on and allows a current to flow from its collector to its emitter. The sense IGBT 1b is an element for monitoring the current flowing through the main IGBT 1a. When the drive signal s0 instructs the turning on of the main IGBT 1a, the sense IGBT 1b allows a sense current proportional to the current flowing through the main IGBT 1a to flow from its collector to its sense emitter.

Figure 2:
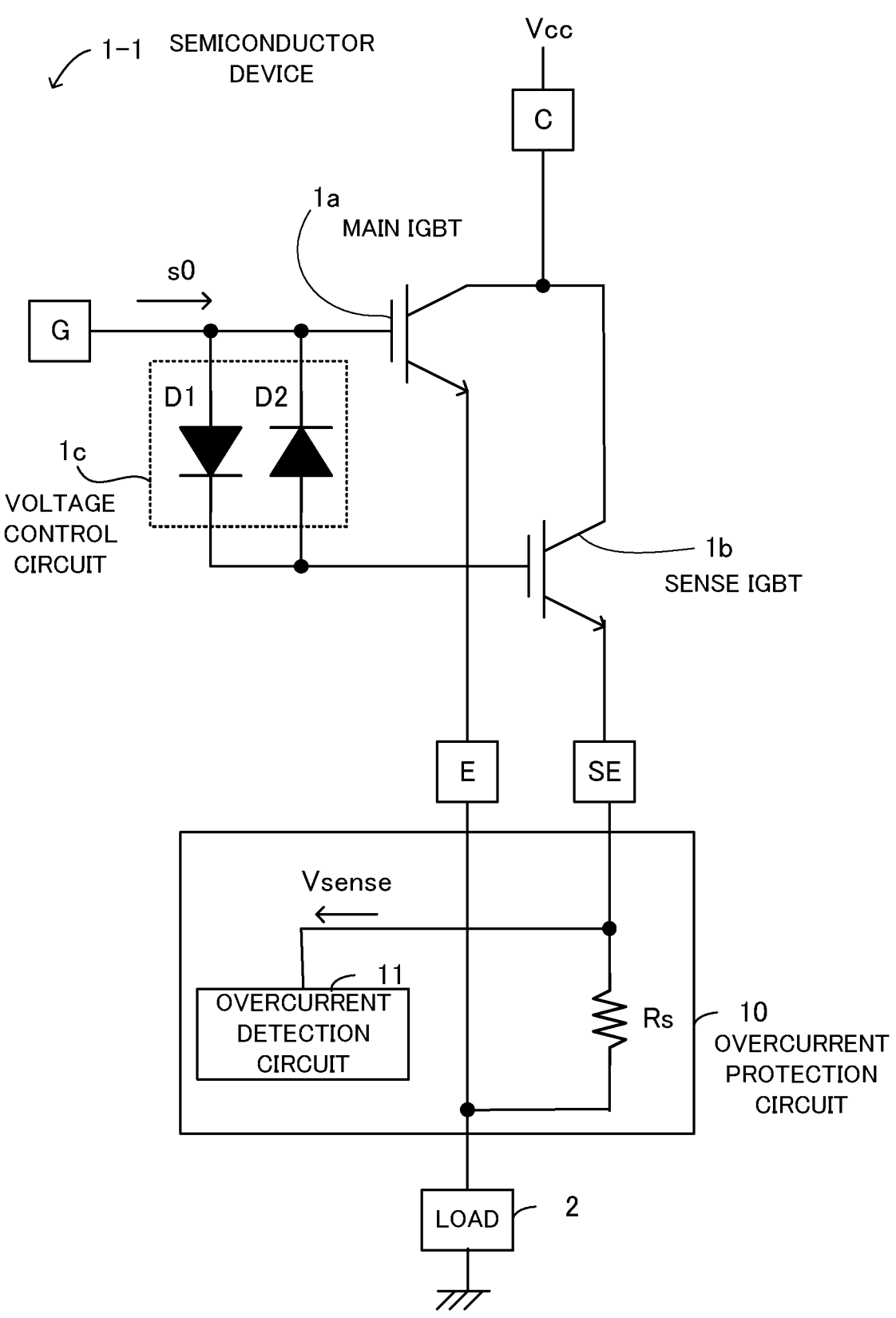
FIG. 2 illustrates an example of a configuration of a semiconductor device including an overcurrent protection circuit.

FIG. 2 illustrates an example of a configuration of a semiconductor device including an overcurrent protection circuit. This semiconductor device 1-1 includes a main IGBT 1a, a sense IGBT 1b, a voltage control circuit 1c, and an overcurrent protection circuit 10. The overcurrent protection circuit 10 includes a resistor Rs (a current sensing resistor) and an overcurrent detection circuit 11. A first end of the resistor Rs is connected to the sense emitter of the sense IGBT 1b and an input end of the overcurrent detection circuit 11. A second end of the resistor Rs is connected to the emitter of the main IGBT 1a and the load 2.

A sense current detection signal Vsense that has been obtained by converting the sense current output by the sense IGBT 1b, is output from the first end of the resistor Rs. The overcurrent detection circuit 11 compares the sense current detection signal Vsense with a reference voltage, and detects an overcurrent state of the main IGBT 1a.

In the above-described semiconductor device 1-1, the gate of the main IGBT 1a is connected to the gate of the sense IGBT 1b via the voltage control circuit 1c. In this way, the impact of self-charging, which will be described below, is reduced, and an oscillation that occurs in the sense current detection signal Vsense in a transient sense period of the sense current detection signal Vsense is reduced.

Figure 3:
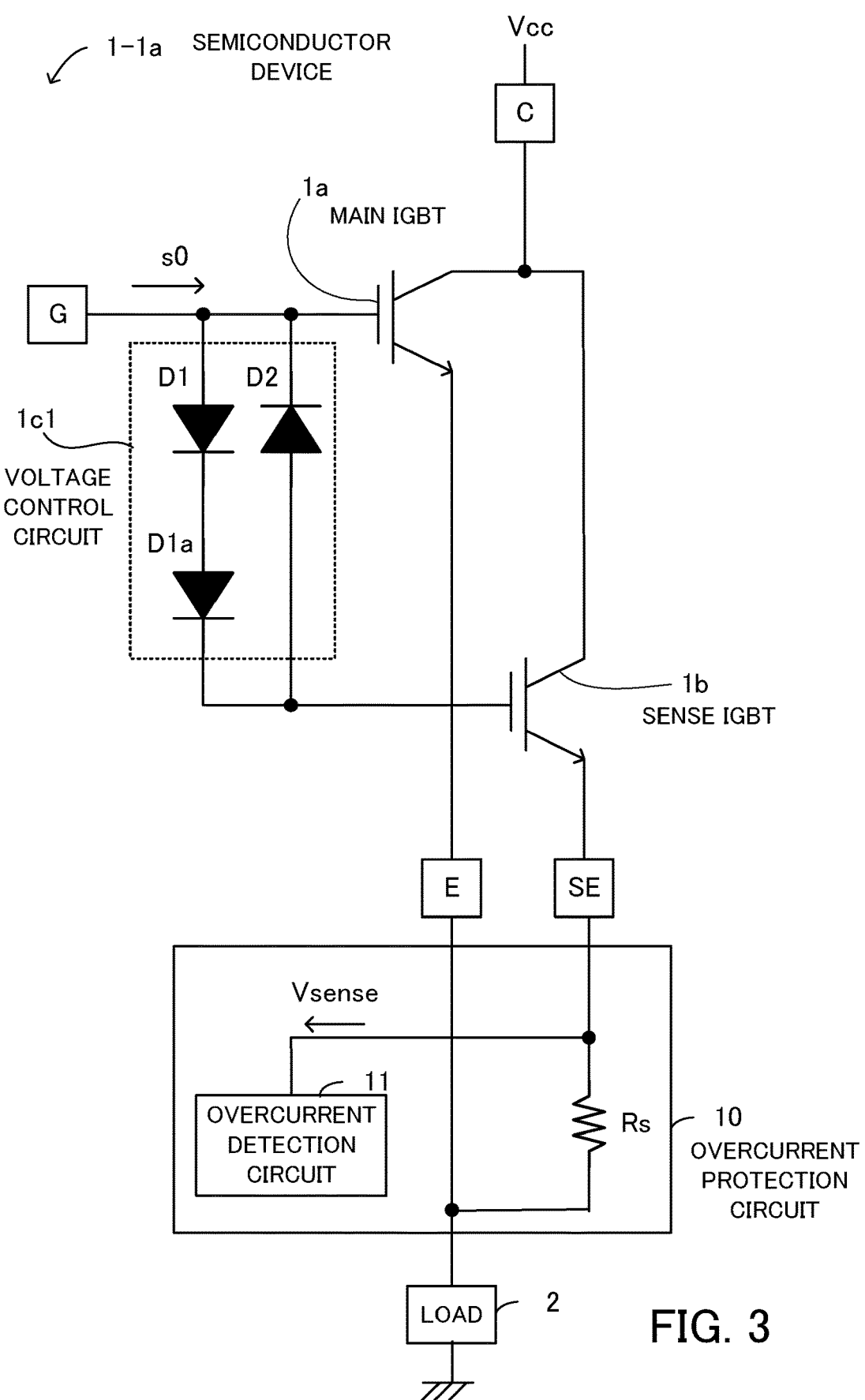
FIG. 3 illustrates an example of a configuration of a semiconductor device including an overcurrent protection circuit.

FIG. 3 illustrates an example of a configuration of a semiconductor device including an overcurrent protection circuit. This semiconductor device 1-1a includes a main IGBT 1a, a sense IGBT 1b, a voltage control circuit 1c1, and an overcurrent protection circuit 10. The voltage control circuit 1c1 includes diodes D1, D1a, and D2. The anode of the diode D1a is connected to the cathode of the diode D1. The cathode of the diode D1a is connected to the anode of the diode D2 and the gate of the sense IGBT 1b.

As described above, in the semiconductor device 1-1a, the diode D1a is connected in series with the diode D1, and the other elements are configured in the same way as those in FIG. 2. In the example in FIG. 3, the diode D1a is added such that the two charging diodes are connected in series in two stages. However, more charging diodes may be connected in series in three or more stages.

In the above-described semiconductor device 1-1a, the gate of the main IGBT 1a and the gate of the sense IGBT 1b are connected to each other via the voltage control circuit 1c1. In this way, the impact of self-charging, which will be described below, is reduced, and an oscillation that occurs in a sense current detection signal Vsense in a transient sense period of the sense current detection signal Vsense is reduced.

Figure 4:
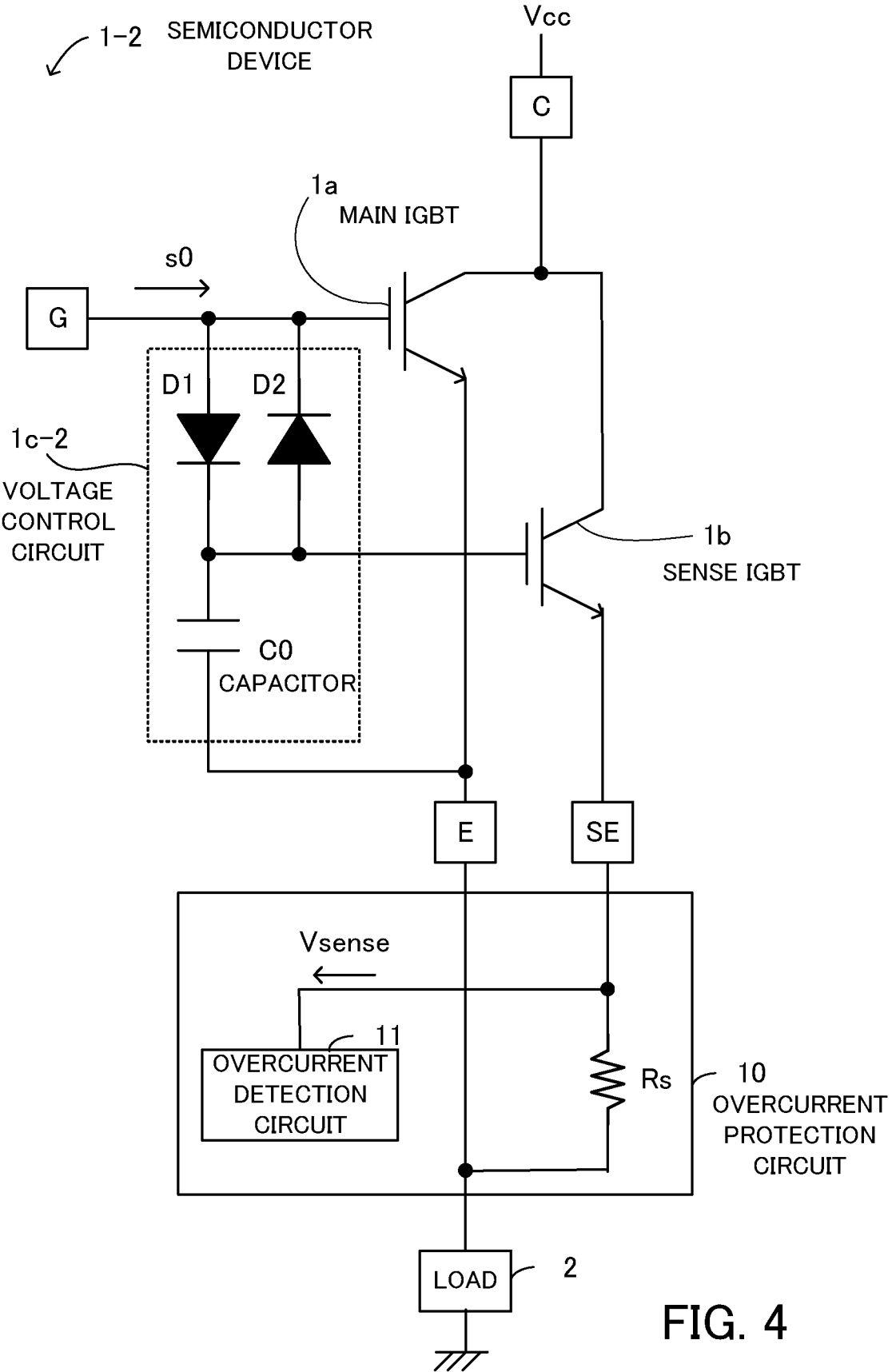
FIG. 4 illustrates an example of a configuration of a semiconductor device including an overcurrent protection circuit.

FIG. 4 illustrates an example of a configuration of a semiconductor device including an overcurrent protection circuit. This semiconductor device 1-2 includes a main IGBT 1a, a sense IGBT 1b, a voltage control circuit 1c-2, and an overcurrent protection circuit 10. The voltage control circuit 1c-2 includes diodes D1 and D2 and a capacitor C0.

A first end of the capacitor C0 is connected to the cathode of the diode D1, the anode of the diode D2, and the gate of the sense IGBT 1b. A second end of the capacitor C0 is connected to the emitter of the main IGBT 1a. The other elements are configured in the same way as those in FIG. 2.

In the above-described semiconductor device 1-2, the gate of the main IGBT 1a and the gate of the sense IGBT 1b are connected to each other via the voltage control circuit 1c-2. In this way, the impact of self-charging, which will be described below, is reduced, and an oscillation that occurs in a sense current detection signal Vsense in a transient sense period of the sense current detection signal Vsense is reduced.

<Self-Charging of Sense IGBT>

Figure 5:
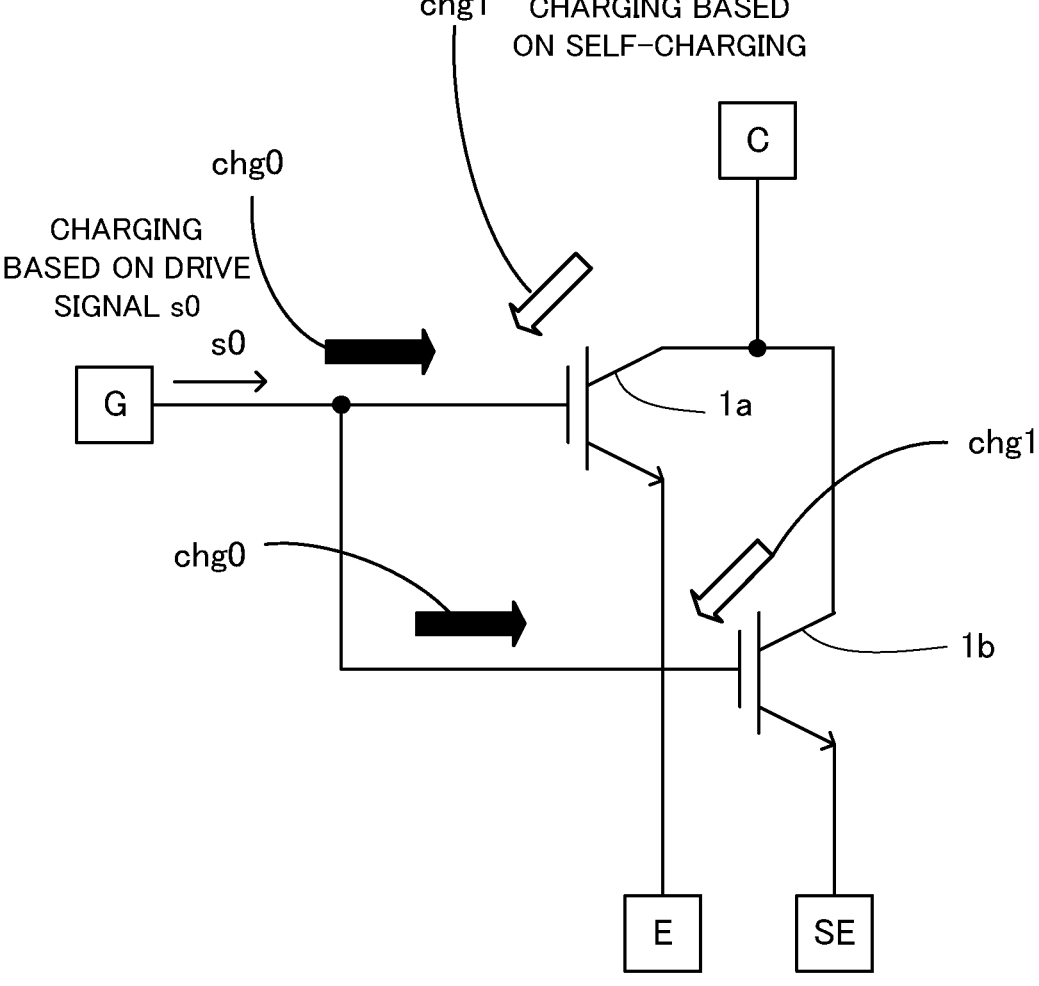
FIG. 5 illustrates self-charging of a sense IGBT.

FIG. 5 illustrates self-charging of a sense IGBT. In the case of a power semiconductor element such as an IGBT, a phenomenon referred to as self-charging occurs when an IGBT turns on.

Self-charging is a phenomenon in which holes injected from the collector of an IGBT charge the gate oxide film around a trench portion and raise the gate voltage.

If self-charging occurs, not only charging chg0 based on a drive signal s0 output from a gate driver raises the gate voltage, but also charging chg1 based on self-charging raises the gate voltage.

In addition, in most cases, the chip area of a sense IGBT 1b is smaller than the chip area of a main IGBT 1a. Thus, because the main IGBT 1a differs from the sense IGBT 1b in chip area, the main IGBT 1a also differs from the sense IGBT 1b in parasitic GE (gate and emitter) capacitance.

Thus, if the drive signal s0 instructs the turning on of the main IGBT 1a, because the sense IGBT 1b is charged faster than the main IGBT 1a and starts to turn on, the sense IGBT 1b turns on before the main IGBT 1a. As a result, before the main IGBT 1a, the sense IGBT 1b is affected by the electromotive force based on the physical difference in wiring path around the IGBTs.

As described above, the gate voltage of the sense IGBT 1b is increased by the charging chg1 based on self-charging before the gate voltage of the main IGBT 1a. Thus, the waveform of a sense current detection signal Vsense output based on a sense current that flows from the sense emitter of the sense IGBT 1b is raised by the charging chg1 based on self-charging in a transient sense period. That is, an oscillation is caused.

In addition, if the voltage level of the oscillation is high, as described above, the overcurrent detection circuit could malfunction or devices such as the IGBTs could break. In view of the above-described point, the present embodiment reduces the oscillation by connecting a voltage control circuit including bidirectional diodes (diodes D1 and D2) to the gate of a sense IGBT.

<Simulated Waveforms>

Figure 6:
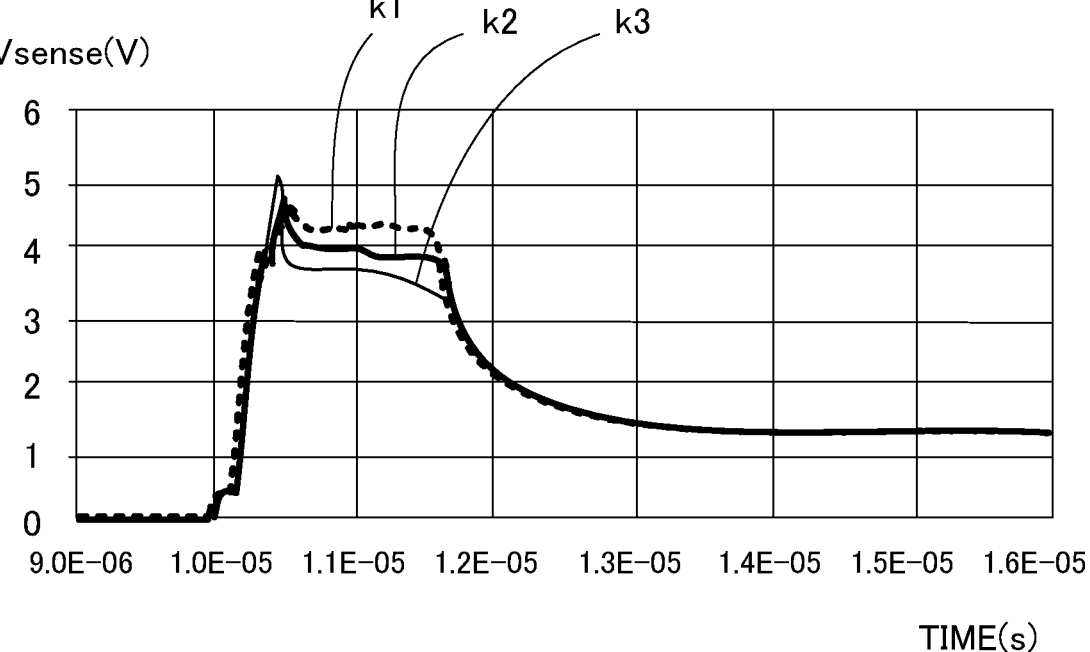
FIG. 6 illustrates examples of simulated waveforms.

FIG. 6 illustrates examples of simulated waveforms. The vertical axis represents the voltage (V) of a sense current detection signal Vsense, and the horizontal axis represents time (s).

[Waveform k1] This is a waveform of a sense current detection signal Vsense of a semiconductor device (a conventional device) having no voltage control circuit. When a main IGBT 1a and a sense IGBT 1b turn on, the sense current detection signal Vsense is output.

[Waveform k2] This is a waveform of the sense current detection signal Vsense of the semiconductor device 1-1 (FIG. 2) having the voltage control circuit 1c. The semiconductor device 1-1 reduces the impact of self-charging by utilizing a drop of a forward-direction voltage Vf of the diode D1. That is, the semiconductor device 1-1 reduces the oscillation of the sense current detection signal Vsense by dropping a gate voltage of the sense IGBT 1b.

[Waveform k3] This is a waveform of the sense current detection signal Vsense of the semiconductor device 1-1a (FIG. 3) having the voltage control circuit 1c1. In the semiconductor device 1-1a, as described above, the diode D1a is connected in series with the diode D1, and the number of stages of charging diodes connected in series is 2. By increasing the number of stages of these charging diodes, the forward-direction voltage Vf is further dropped than that of the semiconductor device 1-1, and consequently the gate voltage of the sense IGBT 1b is further dropped. Thus, the oscillation of the sense current detection signal Vsense is further reduced.

As described above, with these configurations according to the present embodiment, it is possible to reduce the oscillation that occurs in the sense current detection signal Vsense in a transient sense period of the sense current detection signal Vsense.

Figure 7:
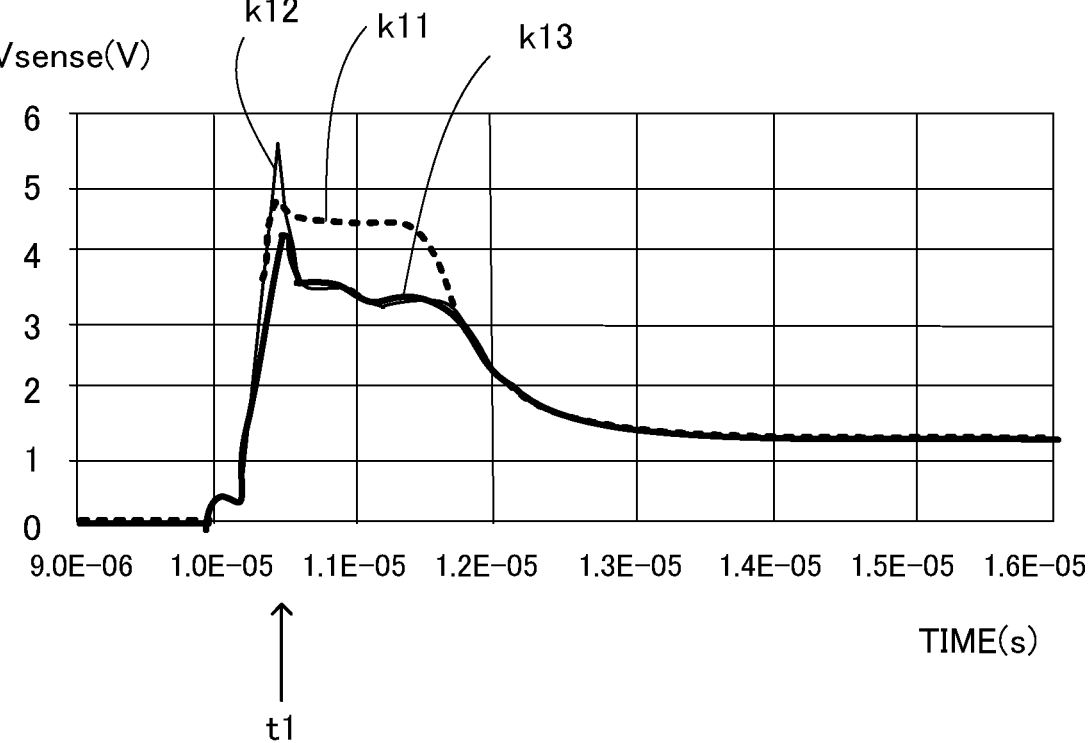
FIG. 7 illustrates examples of simulated waveforms.

FIG. 7 illustrates examples of simulated waveforms. The vertical axis represents the voltage (V) of a sense current detection signal Vsense, and the horizontal axis represents time (s).

[Waveform k11] This is a waveform of a sense current detection signal Vsense of a semiconductor device (a conventional device) having no voltage control circuit. When a main IGBT 1a and a sense IGBT 1b turn on, the sense current detection signal Vsense is output.

[Waveform k12] This is a waveform of the sense current detection signal Vsense of the semiconductor device 1-1 (FIG. 2) having the voltage control circuit 1c. The semiconductor device 1-1 drops the gate voltage of the sense IGBT 1b by utilizing the forward-direction voltage drop of the diode D1, and consequently reduces the oscillation of the sense current detection signal Vsense.

[Waveform k13] This is a waveform of the sense current detection signal Vsense of the semiconductor device 1-2 (FIG. 4) having the voltage control circuit 1c-2. As described above, the semiconductor device 1-2 includes the capacitor C0, in addition to the diodes D1 and D2.

In FIG. 7, when the sense IGBT 1b turns on at time t1, a voltage overshoot occurs in the sense current detection signal Vsense. Thus, by providing the semiconductor device 1-2 with the capacitor C0, the charges based on self-charging that are accumulated in the gate of the sense IGBT 1b are transferred by the capacitor C0 to the emitter of the main IGBT 1a.

As a result, the semiconductor device 1-2 reduces the oscillation of the sense current detection signal Vsense, and reduces the overshoot of the gate voltage when the sense IGBT 1b turns on.

Modification Examples

Figure 8:
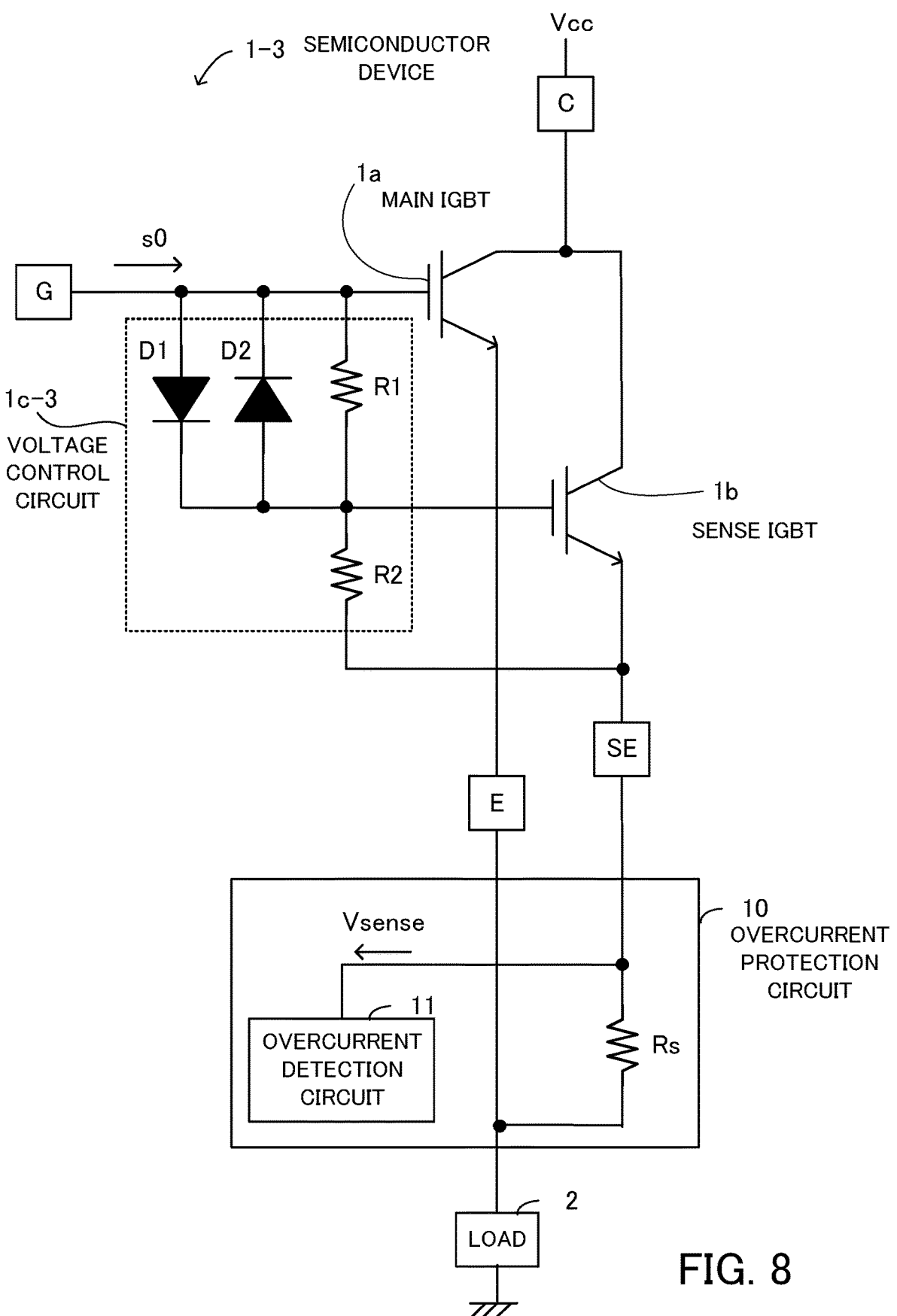
FIG. 8 illustrates an example of a configuration of a semiconductor device including an overcurrent protection circuit.

FIG. 8 illustrates an example of a configuration of a semiconductor device including an overcurrent protection circuit. This semiconductor device 1-3 includes a main IGBT 1a, a sense IGBT 1b, a voltage control circuit 1c-3, and an overcurrent protection circuit 10. The voltage control circuit 1c-3 includes diodes D1 and D2 and resistors R1 (a first resistor) and R2 (a second resistor). The resistors R1 and R2 constitute a voltage-dividing circuit.

The collector of the main IGBT 1a and the collector of the sense IGBT 1b are connected to a power supply voltage Vcc via a terminal C. The emitter of the main IGBT 1a is connected to a load 2 via a terminal E.

The gate of the main IGBT 1a is connected to a terminal G, the anode of the diode D1, the cathode of the diode D2, and a first end of the resistor R1. The gate of the sense IGBT 1b is connected to the cathode of the diode D1, the anode of the diode D2, a second end of the resistor R1, and a first end of the resistor R2. A second end of the resistor R2 is connected to the sense emitter of the sense IGBT 1b and a terminal SE.

In addition, the overcurrent protection circuit 10 includes a resistor Rs (a current sensing resistor) and an overcurrent detection circuit 11. A first end of the resistor Rs is connected to the sense emitter of the sense IGBT 1b, the second end of the resistor R2, and an input end of the overcurrent detection circuit 11. A second end of the resistor Rs is connected to the emitter of the main IGBT 1a and the load 2.

In the case of the above-described semiconductor device 1-3, the voltage control circuit 1c-3 includes bidirectional diodes including the diodes D1 and D2, which are disposed between the gate of the main IGBT 1a and the gate of the sense IGBT 1b, and includes the resistors R1 and R2 that divide the gate voltage of the main IGBT 1a and apply the divided voltage to the gate of the sense IGBT 1b.

This configuration of the semiconductor device 1-3 also reduces the oscillation that occurs in a sense current detection signal Vsense in a transient sense period of the sense current detection signal Vsense. In addition, because not only the forward-direction voltage drop by the diode D1 but also the voltage-dividing resistors reduce the gate voltage of the sense IGBT 1b, it is possible to further drop the gate voltage of the sense IGBT 1b. Therefore, the semiconductor device 1-3 reduces the impact of self-charging efficiently.

Figure 9:
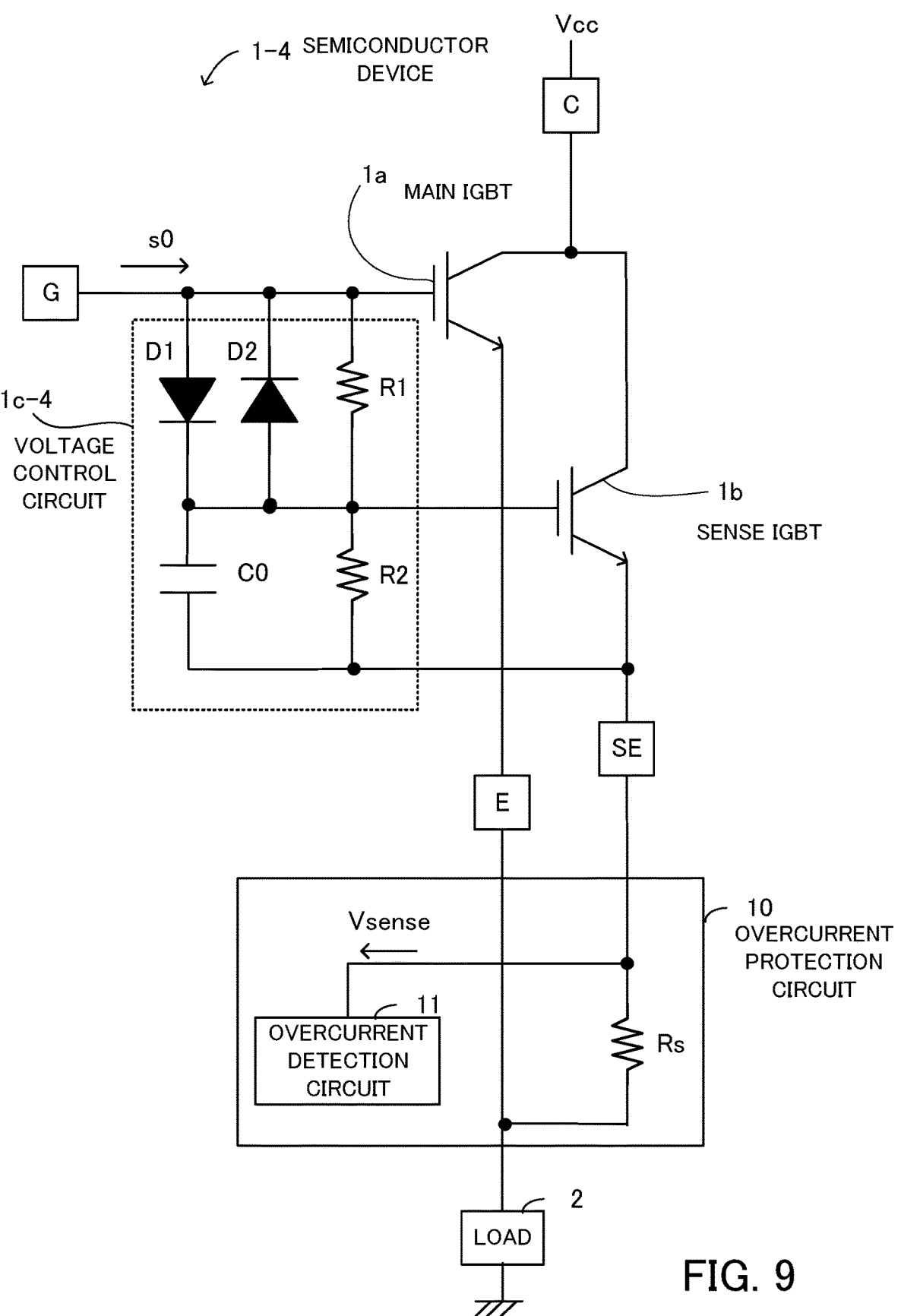
FIG. 9 illustrates an example of a configuration of a semiconductor device including an overcurrent protection circuit.

FIG. 9 illustrates an example of a configuration of a semiconductor device including an overcurrent protection circuit. This semiconductor device 1-4 includes a main IGBT 1a, a sense IGBT 1b, a voltage control circuit 1c-4, and an overcurrent protection circuit 10. The voltage control circuit 1c-4 includes diodes D1 and D2, resistors R1 and R2, and a capacitor C0.

A first end of the capacitor C0 is connected to the cathode of the diode D1, the anode of the diode D2, a second end of the resistor R1, a first end of the resistor R2, and the gate of the sense IGBT 1b. A second end of the capacitor C0 is connected to a second end of the resistor R2 and the sense emitter of the sense IGBT 1b. The other elements are configured in the same way as those in FIG. 8.

In the case of the above-described semiconductor device 1-4, the voltage control circuit 1c-4 includes bidirectional diodes including the diodes D1 and D2, which are disposed between the gate of the main IGBT 1a and the gate of the sense IGBT 1b, and includes the resistors R1 and R2 that divide the gate voltage of the main IGBT 1a and apply the divided voltage to the gate of the sense IGBT 1b. In addition, the capacitor C0 is disposed between the gate and the sense emitter of the sense IGBT 1b.

This configuration of the semiconductor device 1-4 also reduces the oscillation that occurs in a sense current detection signal Vsense in a transient sense period of the sense current detection signal Vsense. In addition, because not only the forward-direction voltage drop by the diode D1 but also the voltage-dividing resistors reduce the gate voltage of the sense IGBT 1b, it is possible to further drop the gate voltage of the sense IGBT 1b. The semiconductor device 1-4 also has an advantageous effect of having the capacitor C0 transfer the charges based on self-charging to the sense emitter.

Figure 10:
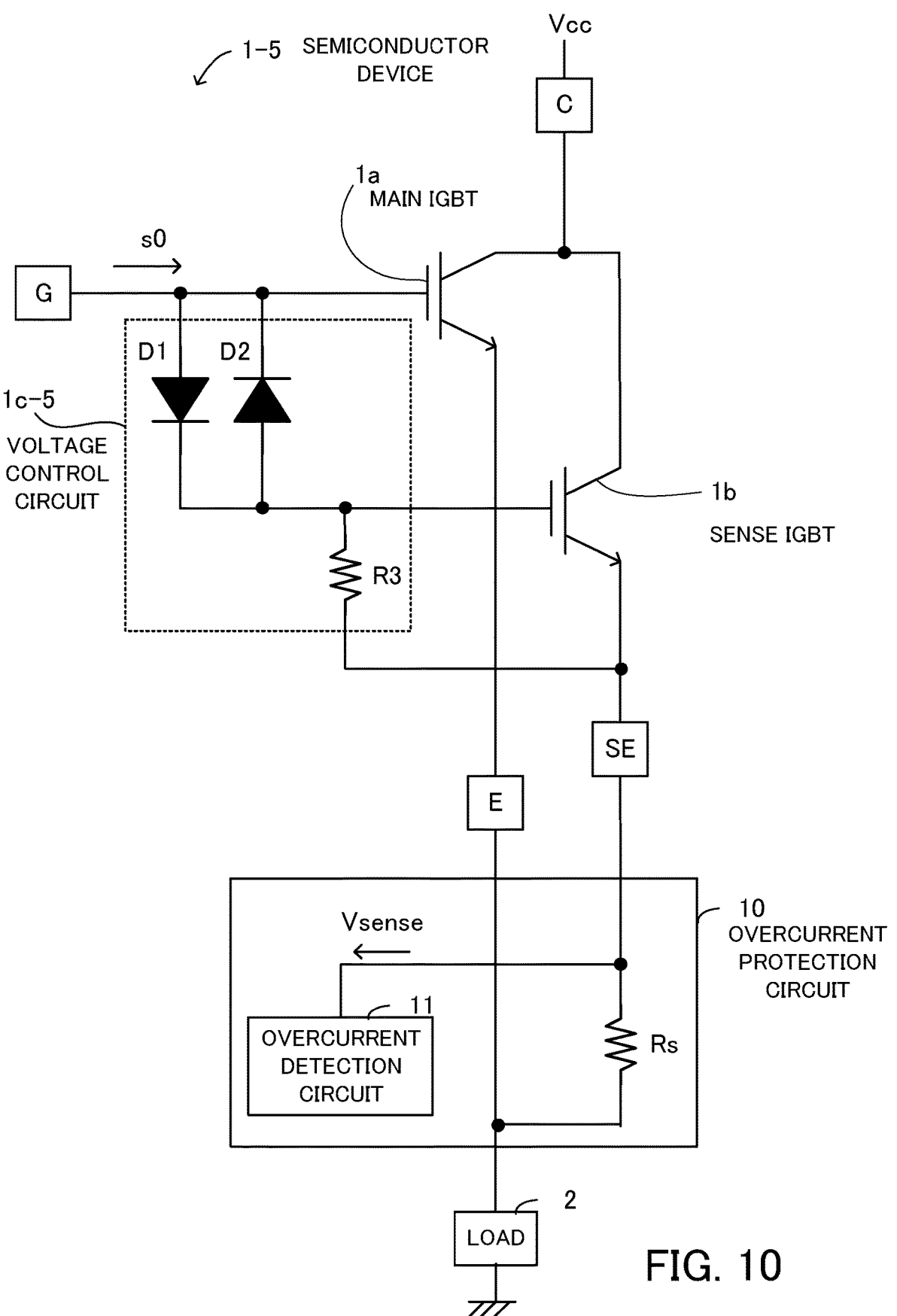
FIG. 10 illustrates an example of a configuration of a semiconductor device including an overcurrent protection circuit.

FIG. 10 illustrates an example of a configuration of a semiconductor device including an overcurrent protection circuit. This semiconductor device 1-5 includes a main IGBT 1a, a sense IGBT 1b, a voltage control circuit 1c-5, and an overcurrent protection circuit 10. The voltage control circuit 1c-5 includes diodes D1 and D2 and a resistor R3.

A first end of the resistor R3 is connected to the cathode of the diode D1, the anode of the diode D2, and the gate of the sense IGBT 1b. A second end of the resistor R3 is connected to the sense emitter of the sense IGBT 1b. The other elements are configured in the same way as those in FIG. 2.

In the case of the above-described semiconductor device 1-5, in the voltage control circuit 1c-5, bidirectional diodes including the diodes D1 and D2 are disposed between the gate of the main IGBT 1a and the gate of the sense IGBT 1b. In addition, the resistor R3 is disposed between the gate and the sense emitter of the sense IGBT 1b.

This configuration of the semiconductor device 1-5 also reduces the oscillation that occurs in a sense current detection signal Vsense in a transient sense period of the sense current detection signal Vsense. In addition, the forward-direction voltage Vf that has already been dropped by the diode D1 is further dropped by the resistor R3. That is, because not only the forward-direction voltage drop by the diode D1 but also the resistor R3 reduces the gate voltage of the sense IGBT 1b, it is possible to reduce the impact of self-charging.

Figure 11:
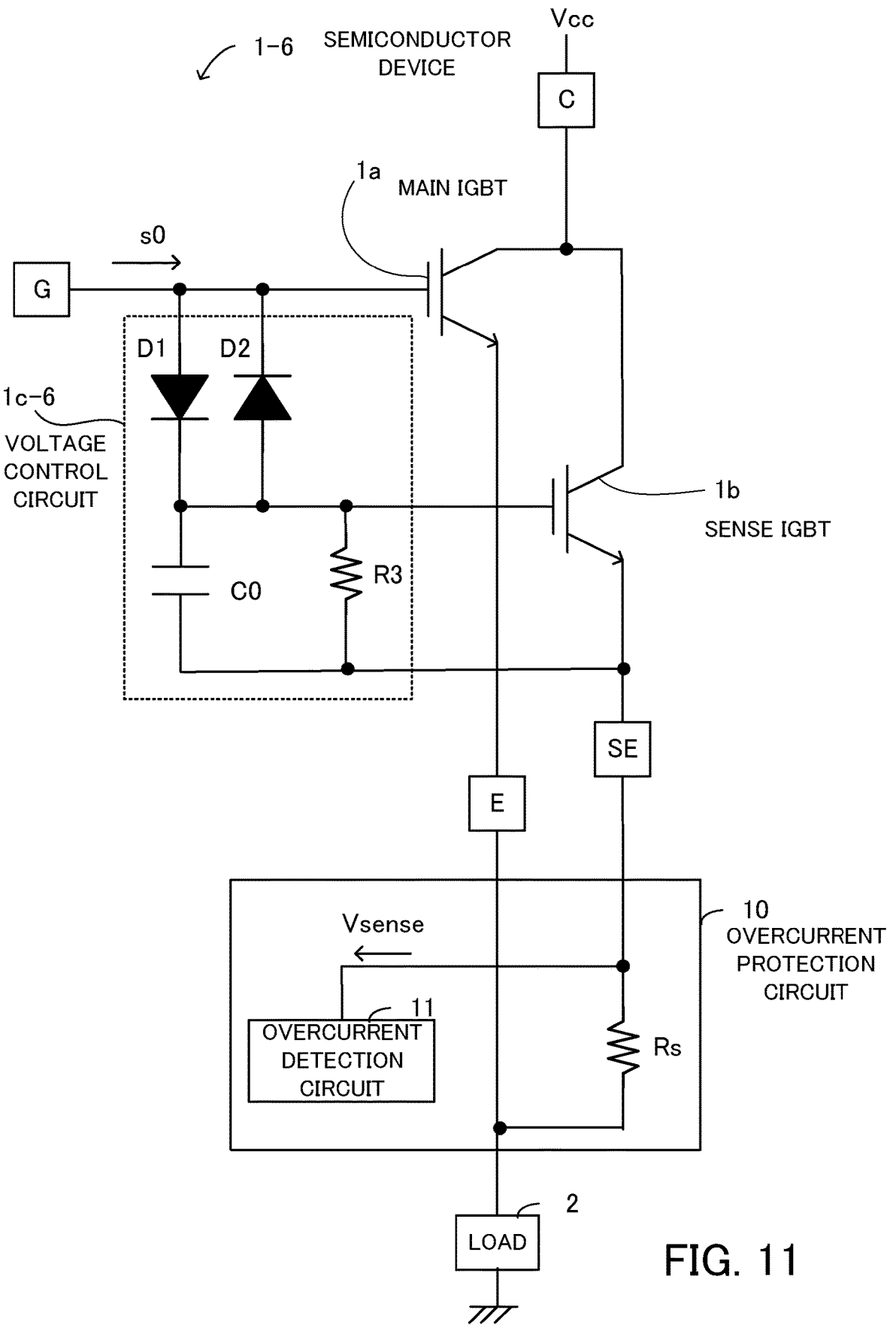
FIG. 11 illustrates an example of a configuration of a semiconductor device including an overcurrent protection circuit.

FIG. 11 illustrates an example of a configuration of a semiconductor device including an overcurrent protection circuit. This semiconductor device 1-6 includes a main IGBT 1a, a sense IGBT 1b, a voltage control circuit 1c-6, and an overcurrent protection circuit 10. The voltage control circuit 1c-6 includes diodes D1 and D2, a resistor R3, and a capacitor C0.

A first end of the capacitor C0 is connected to the cathode of the diode D1, the anode of the diode D2, a first end of the resistor R3, and the gate of the sense IGBT 1b. A second end of the capacitor C0 is connected to a second end of the resistor R3 and the sense emitter of the sense IGBT 1b. The other elements are configured in the same way as those in FIG. 10.

In the case of the above-described semiconductor device 1-6, in the voltage control circuit 1c-6, bidirectional diodes including the diodes D1 and D2 are disposed between the gate of the main IGBT 1a and the gate of the sense IGBT 1b. In addition, the resistor R3 is disposed between the gate and the sense emitter of the sense IGBT 1b. In addition, the capacitor C0 is disposed between the gate and the sense emitter of the sense IGBT 1b.

This configuration of the semiconductor device 1-6 also reduces the oscillation that occurs in a sense current detection signal Vsense in a transient sense period of the sense current detection signal Vsense. In addition, the forward-direction voltage Vf that has already been dropped by the diode D1 is further dropped by the resistor R3. That is, not only the forward-direction voltage drop by the diode D1 but also the resistor R3 reduces the gate voltage of the sense IGBT 1b. The semiconductor device 1-6 also has an advantageous effect of having the capacitor C0 transfer the charges based on self-charging to the sense emitter.

<Overcurrent Protection Device>

Figure 12:
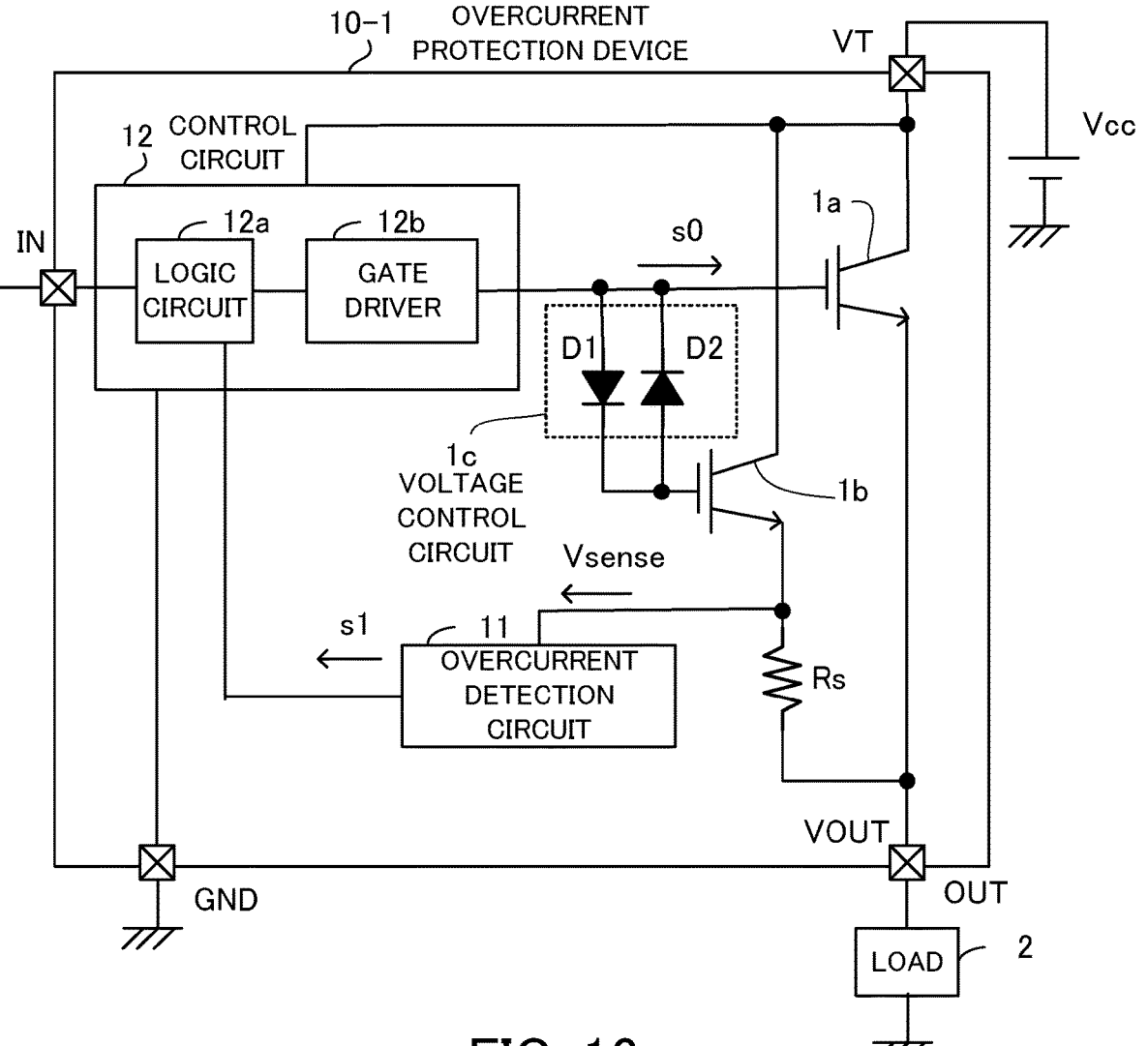
FIG. 12 illustrates an example of a configuration of an overcurrent protection device.

Hereinafter, overcurrent protection devices to which semiconductor devices according to the present embodiment are applied will be described. FIG. 12 illustrates an example of a configuration of an overcurrent protection device. This overcurrent protection device 10-1 includes an input terminal IN, an output terminal OUT, a power supply terminal VT, and a ground terminal GND.

The input terminal IN receives a pulsed control signal output from a microcomputer or the like. The output terminal OUT is connected to a load 2. The power supply terminal VT is connected to a power supply voltage Vcc, and the ground terminal GND is connected to a ground point (GND).

The overcurrent protection device 10-1 includes a main IGBT 1a, a sense IGBT 1b, a voltage control circuit 1c, a resistor Rs, an overcurrent detection circuit 11, and a control circuit 12. The control circuit 12 includes a logic circuit 12a and a gate driver 12b.

The logic circuit 12a receives the control signal input through the input terminal IN and generates a logic signal for turning on or off the main IGBT 1a. Based on the logic signal output from the logic circuit 12a, the gate driver 12b generates a drive signal s0 for turning on or off the main IGBT 1a and applies the drive signal s0 to the gate of the main IGBT 1a.

The resistor Rs is connected between the sense emitter of the sense IGBT 1b and the emitter of the main IGBT 1a, and detects a potential that occurs when a sense current flowing from the sense emitter flows through the resistor Rs. The sense current is consequently detected as a sense current detection signal Vsense.

The overcurrent detection circuit 11 detects whether the main IGBT 1a is in an overcurrent state by comparing the sense current detection signal Vsense with a reference voltage. If the overcurrent detection circuit 11 detects that the main IGBT 1a is in an overcurrent state, the overcurrent detection circuit 11 outputs an overcurrent detection signal s1. If the logic circuit 12a detects the overcurrent detection signal s1, the logic circuit 12a turns off the main IGBT 1a.

In this way, because the overcurrent protection device 10-1 having the configuration of the semiconductor device 1-1 in FIG. 2 reduces the oscillation of the sense current detection signal Vsense, the overcurrent protection device 10-1 prevents the overcurrent detection circuit 11 from malfunctioning due to an oscillation and achieves accurate overcurrent detection and protection. While not illustrated, one or more diodes may additionally be connected in series with the charging diode D1 such that two or more stages are configured as described with reference to FIG. 3.

Figure 13:
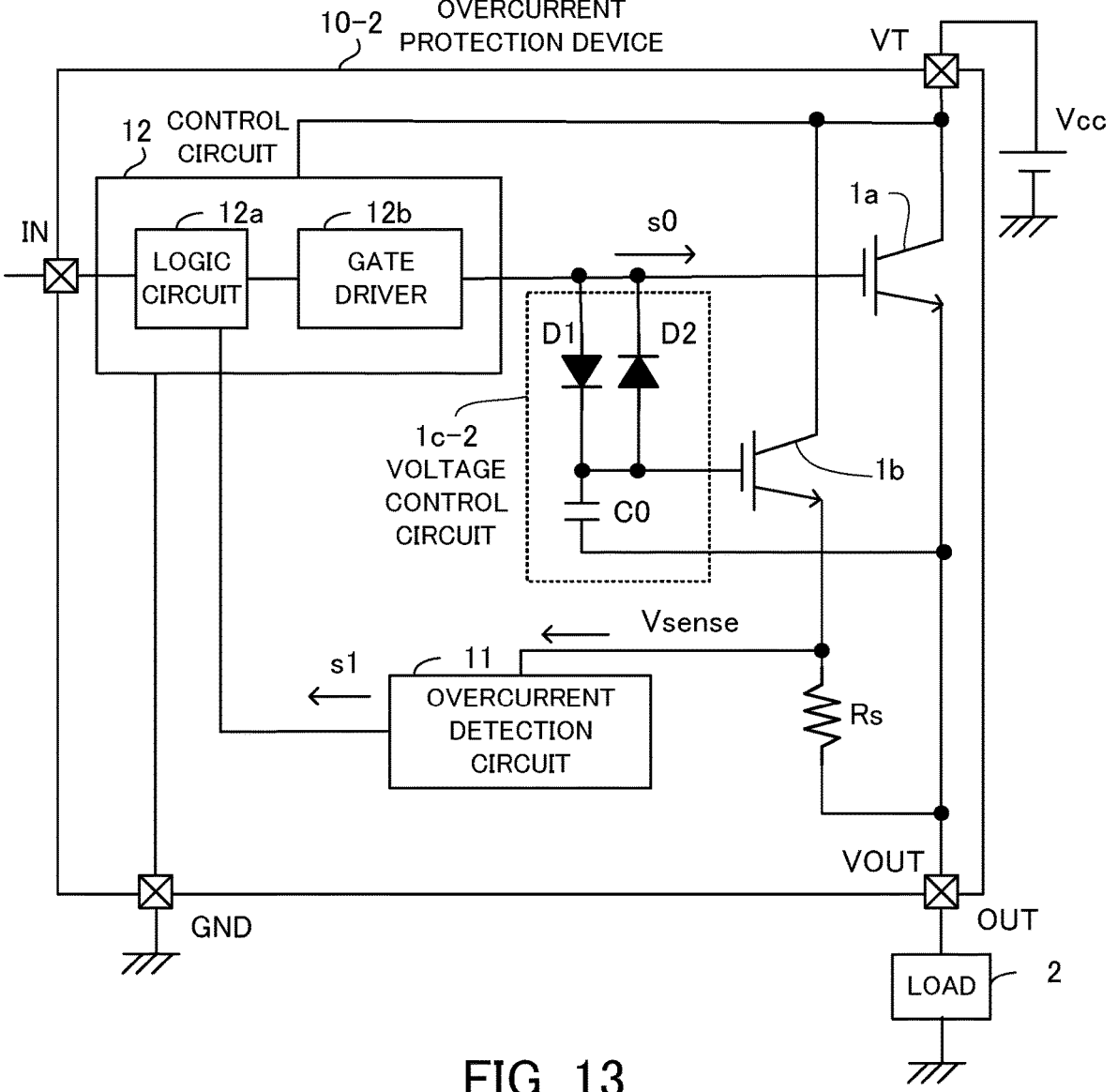
FIG. 13 illustrates an example of a configuration of an overcurrent protection device.

FIG. 13 illustrates an example of a configuration of an overcurrent protection device. This overcurrent protection device 10-2 includes a main IGBT 1a, a sense IGBT 1b, a voltage control circuit 1c-2, a resistor Rs, an overcurrent detection circuit 11, and a control circuit 12. The overcurrent protection device 10-2 is a device to which the semiconductor device 1-2 in FIG. 4 has been applied. The overcurrent protection device 10-2 also reduces the oscillation of the sense current detection signal Vsense, prevents the overcurrent detection circuit 11 from malfunctioning due to an oscillation, and achieves accurate overcurrent detection and protection.

Figure 14:
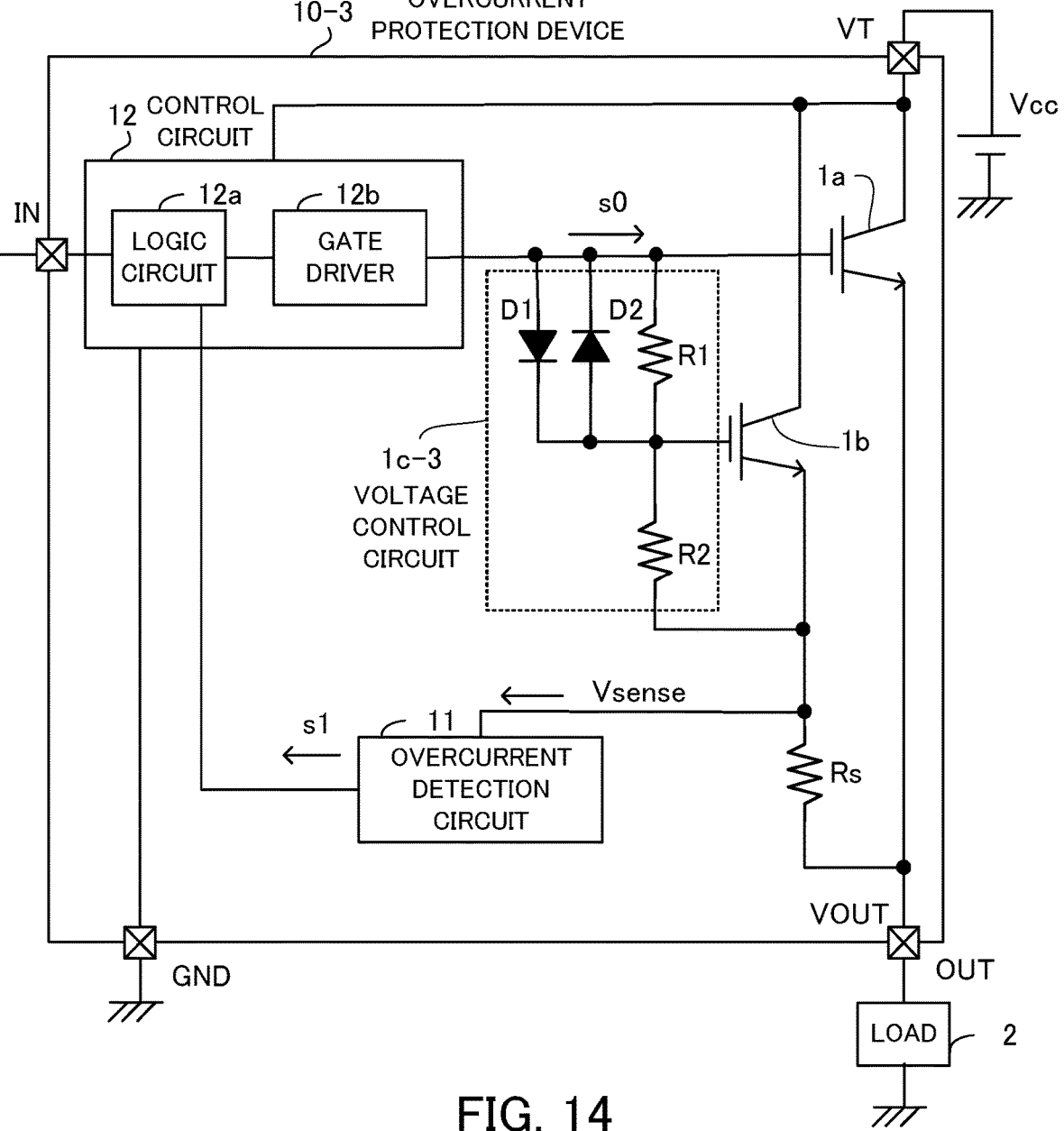
FIG. 14 illustrates an example of a configuration of an overcurrent protection device.

FIG. 14 illustrates an example of a configuration of an overcurrent protection device. This overcurrent protection device 10-3 includes a main IGBT 1a, a sense IGBT 1b, a voltage control circuit 1c-3, a resistor Rs, an overcurrent detection circuit 11, and a control circuit 12. The overcurrent protection device 10-3 is a device to which the semiconductor device 1-3 in FIG. 8 has been applied. The overcurrent protection device 10-3 also reduces the oscillation of the sense current detection signal Vsense, prevents the overcurrent detection circuit 11 from malfunctioning due to an oscillation, and achieves accurate overcurrent detection and protection.

Figure 15:
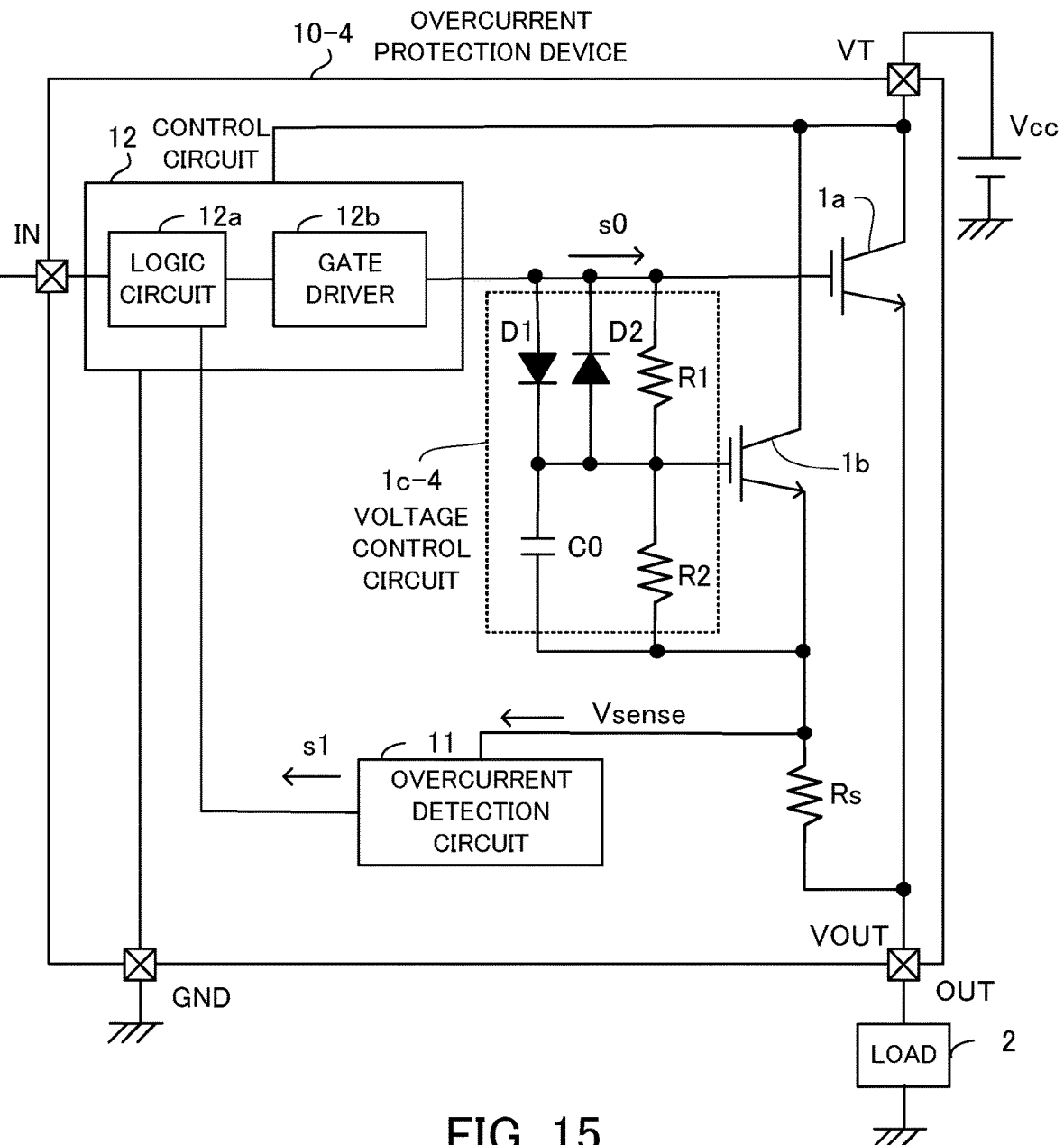
FIG. 15 illustrates an example of a configuration of an overcurrent protection device.

FIG. 15 illustrates an example of a configuration of an overcurrent protection device. This overcurrent protection device 10-4 includes a main IGBT 1a, a sense IGBT 1b, a voltage control circuit 1c-4, a resistor Rs, an overcurrent detection circuit 11, and a control circuit 12. The overcurrent protection device 10-4 is a device to which the semiconductor device 1-4 in FIG. 9 has been applied. The overcurrent protection device 10-4 also reduces the oscillation of the sense current detection signal Vsense, prevents the overcurrent detection circuit 11 from malfunctioning due to an oscillation, and achieves accurate overcurrent detection and protection.

Figure 16:
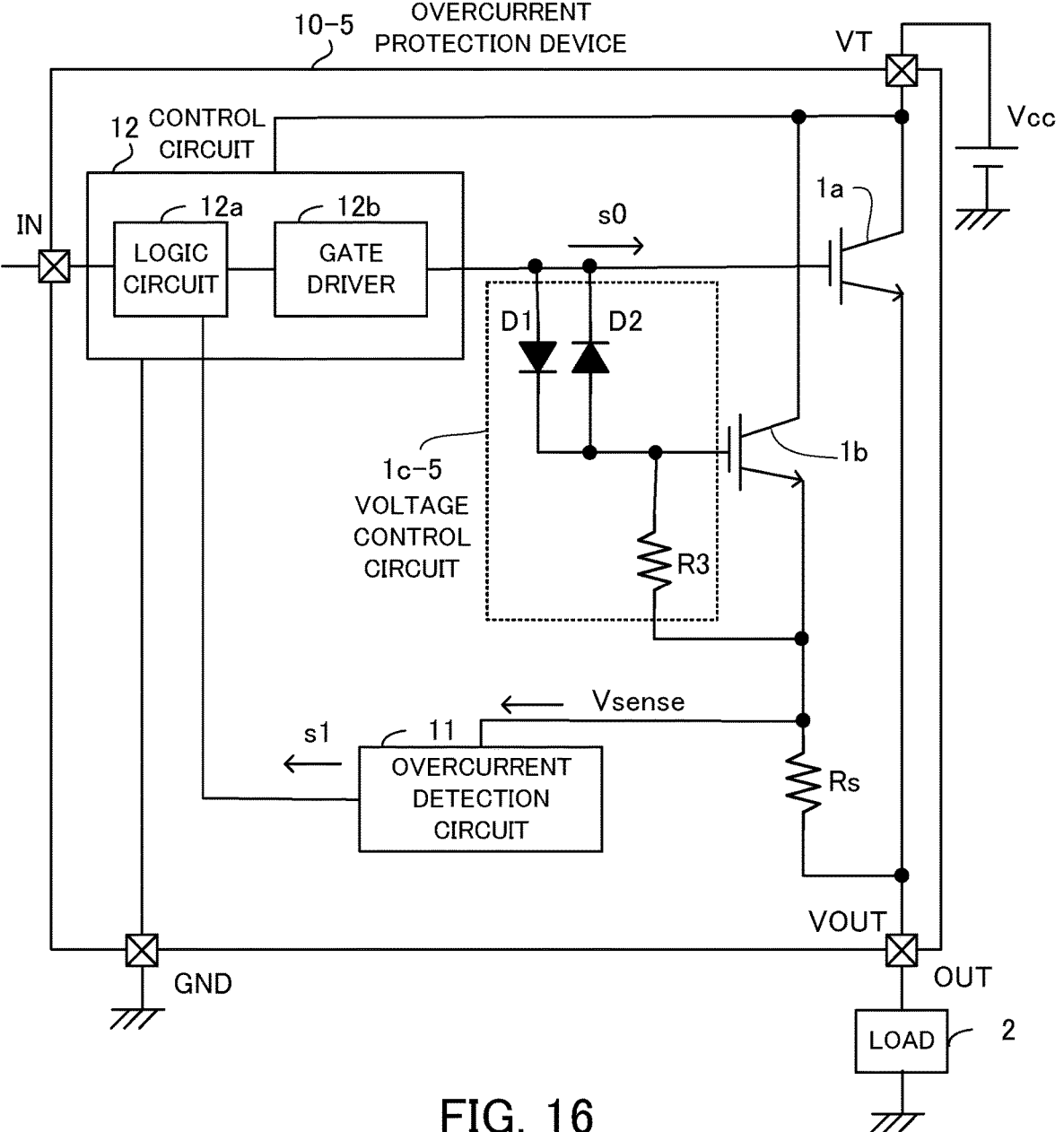
FIG. 16 illustrates an example of a configuration of an overcurrent protection device.

FIG. 16 illustrates an example of a configuration of an overcurrent protection device. This overcurrent protection device 10-5 includes a main IGBT 1a, a sense IGBT 1b, a voltage control circuit 1c-5, a resistor Rs, an overcurrent detection circuit 11, and a control circuit 12. The overcurrent protection device 10-5 is a device to which the semiconductor device 1-5 in FIG. 10 has been applied. The overcurrent protection device 10-5 also reduces the oscillation of the sense current detection signal Vsense, prevents the overcurrent detection circuit 11 from malfunctioning due to an oscillation, and achieves accurate overcurrent detection and protection.

Figure 17:
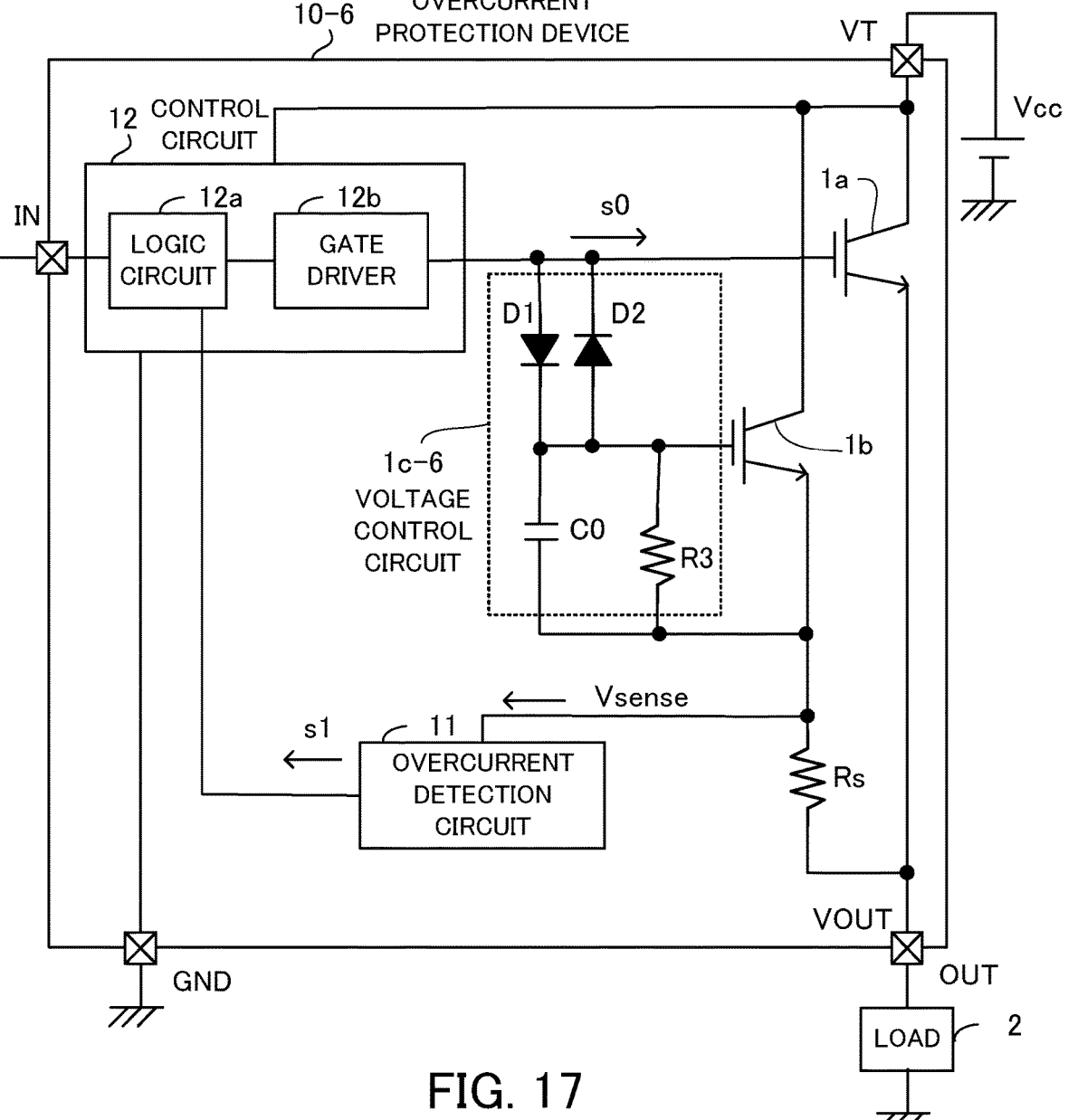
FIG. 17 illustrates an example of a configuration of an overcurrent protection device.

FIG. 17 illustrates an example of a configuration of an overcurrent protection device. This overcurrent protection device 10-6 includes a main IGBT 1a, a sense IGBT 1b, a voltage control circuit 1c-6, a resistor Rs, an overcurrent detection circuit 11, and a control circuit 12. The overcurrent protection device 10-6 is a device to which the semiconductor device 1-6 in FIG. 11 has been applied. The overcurrent protection device 10-6 also reduces the oscillation of the sense current detection signal Vsense, prevents the overcurrent detection circuit 11 from malfunctioning due to an oscillation, and achieves accurate overcurrent detection and protection.

As described above, the embodiments reduce an oscillation that occurs in a sense current detection signal output from a current-monitoring power semiconductor element. In addition, because the oscillation is effectively reduced by passive parts with a small number of elements, the embodiments have an advantageous effect of needing no complex circuit for detecting and controlling the oscillation and preventing the circuit scale from increasing.

While embodiments have thus been described as examples, any one of the individual elements in the embodiments may be replaced by a different element having an equivalent function. In addition, other elements or steps may be added. Two or more of the elements (features) in the above-described embodiments may be combined with each other.

In one aspect, it is possible to reduce an oscillation that occurs in a detected signal of a sense current output from a current-monitoring power semiconductor element.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
an output element configured to switch on and off based on a drive signal, so as to drive a load;
a current monitoring element configured to monitor a current that flows through the output element; and
a voltage control circuit that includes:
a first diode configured to charge a gate voltage applied to a gate of the current monitoring element,
a second diode configured to discharge the gate voltage, so that the voltage control circuit controls the gate voltage, and
a capacitor including:
a first end connected to a cathode of the first diode, an anode of the second diode, and the gate of the current monitoring element, and
a second end connected to an emitter of the output element.

2. The semiconductor device according to claim 1, wherein an anode of the first diode is connected to a gate of the output element and a cathode of the second diode, and the cathode of the first diode is connected to the anode of the second diode and the gate of the current monitoring element.

3. The semiconductor device according to claim 2, wherein
the voltage control circuit further includes a resistor having a first end and a second end,
the first end of the resistor is connected to the cathode of the first diode, the anode of the second diode, and the gate of the current monitoring element, and
the second end of the resistor is connected to a sense emitter of the current monitoring element.

4. The semiconductor device according to claim 3, wherein
the first end of the capacitor is connected to the cathode of the first diode, the anode of the second diode, the first end of the resistor, and the gate of the current monitoring element, and
the second end of the capacitor is connected to the second end of the resistor and the sense emitter of the current monitoring element.

5. The semiconductor device according to claim 1, wherein each of the output element and the current monitoring element is a power semiconductor element configured by any one of an insulated gate bipolar transistor (IGBT), a reverse conducting (RC)-IGBT, or a silicon carbide (SiC) device.

6. An overcurrent protection device, comprising:

a power supply terminal connected to a power supply, and an output terminal connected to a load;

an output element connected to the power supply terminal and being configured to receive a power supply voltage through the power supply terminal, the output element being connected to the output terminal and being configured to switch on and off based on a drive signal, so as to drive the load through the output terminal;

a current monitoring element configured to monitor a current that flows through the output element;

a voltage control circuit that includes:

a first diode configured to charge a gate voltage applied to a gate of the current monitoring element, a second diode configured to discharge the gate voltage, so that the voltage control circuit controls the gate voltage, and a capacitor including:

a first end connected to a cathode of the first diode, an anode of the second diode, and the gate of the current monitoring element, and a second end connected to an emitter of the output element;

a control circuit configured to output the drive signal to the output element to control the switching of the output element;

a current sensing resistor configured to convert a sense current output from the current monitoring element into a voltage and output a converted voltage as a sense current detection signal; and an overcurrent detection circuit configured to detect an overcurrent state of the output element by comparing the sense current detection signal with a reference voltage.

7. The overcurrent protection device according to claim 6, wherein an anode of the first diode is connected to a gate of the output element and a cathode of the second diode, and the cathode of the first diode is connected to the anode of the second diode and the gate of the current monitoring element.

8. The overcurrent protection device according to claim 7, wherein the voltage control circuit further includes a resistor having a first end and a second end, the first end of the resistor is connected to the cathode of the first diode, the anode of the second diode, and the gate of the current monitoring element, and the second end of the resistor is connected to a sense emitter of the current monitoring element.

9. The overcurrent protection device according to claim 8, wherein the first end of the capacitor is connected to the cathode of the first diode, the anode of the second diode, the first end of the resistor, and the gate of the current monitoring element, and the second end of the capacitor is connected to the second end of the resistor and the sense emitter of the current monitoring element.

* * * * *